US009264051B2

(12) United States Patent
Sekiya et al.

(10) Patent No.: US 9,264,051 B2
(45) Date of Patent: Feb. 16, 2016

(54) CLOCK GENERATION CIRCUIT AND ELECTRONIC APPARATUS

(71) Applicant: Sony Corporation, Tokyo (JP)

(72) Inventors: Akito Sekiya, Kanagawa (JP); Eiichi Nakamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/581,200

(22) Filed: Dec. 23, 2014

(65) Prior Publication Data

US 2015/0229312 A1    Aug. 13, 2015

(30) Foreign Application Priority Data

Feb. 10, 2014  (JP) ................... 2014-023331

(51) Int. Cl.
*H03L 7/06* (2006.01)
*H03L 7/08* (2006.01)
*H03K 5/1252* (2006.01)

(52) U.S. Cl.
CPC ............... *H03L 7/08* (2013.01); *H03K 5/1252* (2013.01)

(58) Field of Classification Search
None
See application file for complete search history.

(56) References Cited

U.S. PATENT DOCUMENTS

| 7,187,742 B1 * | 3/2007 | Logue et al. ............ 375/376 |
| 2007/0164835 A1 * | 7/2007 | Co ......................... 332/144 |
| 2009/0121797 A1 * | 5/2009 | Karabatsos ................ 331/57 |
| 2014/0362952 A1 * | 12/2014 | Cheng et al. ............ 375/303 |

FOREIGN PATENT DOCUMENTS

JP    2013-005050    1/2013

* cited by examiner

*Primary Examiner* — Cassandra Cox
(74) *Attorney, Agent, or Firm* — Michael Best & Friedrich LLP

(57) ABSTRACT

A clock generation circuit includes a delay clock generation unit configured to generate a predetermined number of delay clock signals having different delay time periods for a reference clock signal; a low-speed clock generation unit configured to generate a low-speed clock signal having a lower frequency than the reference signal in accordance with a control signal that controls a phase; a control signal processing unit configured to perform, on the control signal, a quantization process for quantizing a value of the control signal into the predetermined number of discrete values and a modulation process for distributing a quantization error in the quantization process in a band of frequencies higher than a predetermined frequency; a selection unit configured to select any one of the predetermined number of delay signals in accordance with the control signal; and an output unit configured to output the low-speed signal in synchronization with the selected signal.

8 Claims, 17 Drawing Sheets

ABSTRACT# CLOCK GENERATION CIRCUIT AND ELECTRONIC APPARATUS

CROSS REFERENCE TO RELATED APPLICATIONS

This application claims the benefit of Japanese Priority Patent Application JP 2014-023331 filed Feb. 10, 2014, the entire contents of which are incorporated herein by reference.

BACKGROUND

The present disclosure relates to a clock generation circuit and an electronic apparatus, and particularly to a clock generation circuit and electronic apparatus that reduce jitter.

In the past, a clock generation circuit has been used to generate clock signals having various frequencies in an electronic apparatus. For example, a clock generation apparatus including a numerically controlled oscillator, a rounding module, a delay-locked loop (DLL), a multiplexer, and a flip-flop is proposed (see, for example, Japanese Patent Application Laid-open No. 2013-005050). The numerically controlled oscillator in the clock generation apparatus generates a clock signal NCOCLK based on a control signal that controls a phase.

Moreover, the DLL generate M (M represents an integer of 2 or more) clock signals DCLK having different phases by delaying a clock signal MCLK with a plurality of stages of delay elements. Moreover, the rounding module performs rounding calculation in which the value of control signal is rounded into an integer of 0 to M−1 (in other words, quantization). The multiplexer selects any one of the M clock signals DCLK in accordance with the control signal quantized into 0 to M−1. The flip-flop outputs a clock signal OUTCLK in synchronization with the selected clock signal DCLK (in other words, by retiming). Accordingly, the phase of the clock signal OUTCLK can be controlled by the phase resolution depending on the number M of clock signals DCLK.

SUMMARY

In the existing technique described above, however, a rounding error being a kind of the quantization error occurs in the rounding calculation, and jitter may be caused in the clock signal OUTCLK due to the error. In order to reduce the quantization error to reduce jitter, it only needs to increase the number M of clock signals DCLK. However, there is a need to increase the number of delay elements in the DLL to increase the number M, which increases the circuit of the DLL in size. Therefore, it is difficult to reduce the jitter in the clock signal OUTCLK.

The present disclosure has been made in view of the above circumstances, and it is desirable to reduce jitter in a clock signal.

According to a first embodiment of the present disclosure, there is provided a clock generation circuit, including a delay clock generation unit configured to generate a predetermined number of delay clock signals having different delay time periods for a reference clock signal, a low-speed clock generation unit configured to generate a low-speed clock signal having a lower frequency than the reference clock signal in accordance with a control signal that controls a phase, a control signal processing unit configured to perform, on the control signal, a quantization process in which a value of the control signal is quantized into the predetermined number of discrete values and a modulation process in which a quantization error occurred in the quantization process is distributed in a band of frequencies higher than a predetermined frequency, a selection unit configured to select any one of the predetermined number of delay clock signals in accordance with the control signal on which the quantization process and the modulation process are performed, and an output unit configured to output the low-speed clock signal in synchronization with the selected delay clock signal. Accordingly, it gives an operation in which any one of a predetermined number of delay clock signals is selected in accordance with the control signal on which a quantization process and a modulation process are performed, and a low-speed clock signal is output in synchronization with the selected delay clock signal.

Moreover, in the first embodiment, the control signal processing unit may be configured to perform the quantization process on the control signal before performing the modulation process on the control signal. Accordingly, it gives an operation in which the quantization process is performed on the control signal before the modulation process is performed on the control signal.

Moreover, in the first embodiment, the modulation process may include generating an integration value by integrating a value of the control signal on which the quantization process is performed in synchronization with the low-speed clock signal, and the control signal processing unit may be configured to perform delay control in the case where the integration value exceeds a predetermined value, the value of the control signal being converted into a difference between the integration value and the predetermined value in the delay control, the converted control signal as well as the low-speed clock signal being delayed in synchronization with the reference clock signal in the delay control. Accordingly, it gives an operation in which, in the case where the integration value exceeds a predetermined value, the value of the control signal is converted into a difference between the integration value and the predetermined value, and is delayed as well as the low-speed clock signal.

The control signal processing unit may be configured to perform the modulation process on the control signal before performing the quantization process on the control signal. Accordingly, it gives an operation in which the quantization process is performed on the control signal before the modulation process is performed on the control signal.

Moreover, in the first embodiment, the low-speed clock generation unit may be configured to integrate the value of the control signal and to generate, as the low-speed clock signal, a signal that represents whether or not the integrate value exceeds a predetermined value, in synchronization with the reference clock signal. Accordingly, it gives an operation in which a signal that represents whether or not the value integrated in synchronization with the reference clock signal exceeds the predetermined value is generated as the low-speed clock signal.

Moreover, in the first embodiment, the control signal may include a predetermined division ratio, and the low-speed clock generation unit may be configured to divide the reference clock signal with the predetermined division ratio included in the control signal and to supply the divided reference clock signal as the low-speed clock signal. Accordingly, it gives an operation in which the reference clock signal is divided with a predetermined division ratio and the divided reference clock signal is supplied as the low-speed clock signal.

Moreover, in the first embodiment, the control signal processing unit may be configured to perform a delta-sigma modulation process as the modulation process. Accordingly, it gives an operation in which the delta-sigma modulation process is performed on the control signal.

According to a second embodiment of the present disclosure, there is provided an electronic apparatus including a delay clock generation unit configured to generate a predetermined number of delay clock signals having different delay time periods for a reference clock signal, a low-speed clock generation unit configured to generate a low-speed clock signal having a lower frequency than the reference clock signal in accordance with a control signal that controls a phase, a control signal processing unit configured to perform, on the control signal, a quantization process in which a value of the control signal is quantized into the predetermined number of discrete values and a modulation process in which a quantization error occurred in the quantization process is distributed in a band of frequencies higher than a predetermined frequency, a selection unit configured to select any one of the predetermined number of delay clock signals in accordance with the control signal on which the quantization process and the modulation process are performed, an output unit configured to output the low-speed clock signal in synchronization with the selected delay clock signal, and an operation circuit configured to operate in synchronization with the output low-speed clock signal. Accordingly, it gives an operation in which any one of a predetermined number of delay clock signals is selected in accordance with the control signal on which a quantization process and a modulation process are performed, and a low-speed clock signal is output in synchronization with the selected delay clock signal.

According to the present disclosure, it is possible to achieve such excellent effects that jitter in a clock signal can be reduced. It should be noted that the effects described above are not necessarily restrictive, and may be any of those described in the present disclosure.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments for carrying out the present disclosure (hereinafter, referred to as embodiments) will be described with reference to the drawings. The description will be made in the following order.

Figure 1:
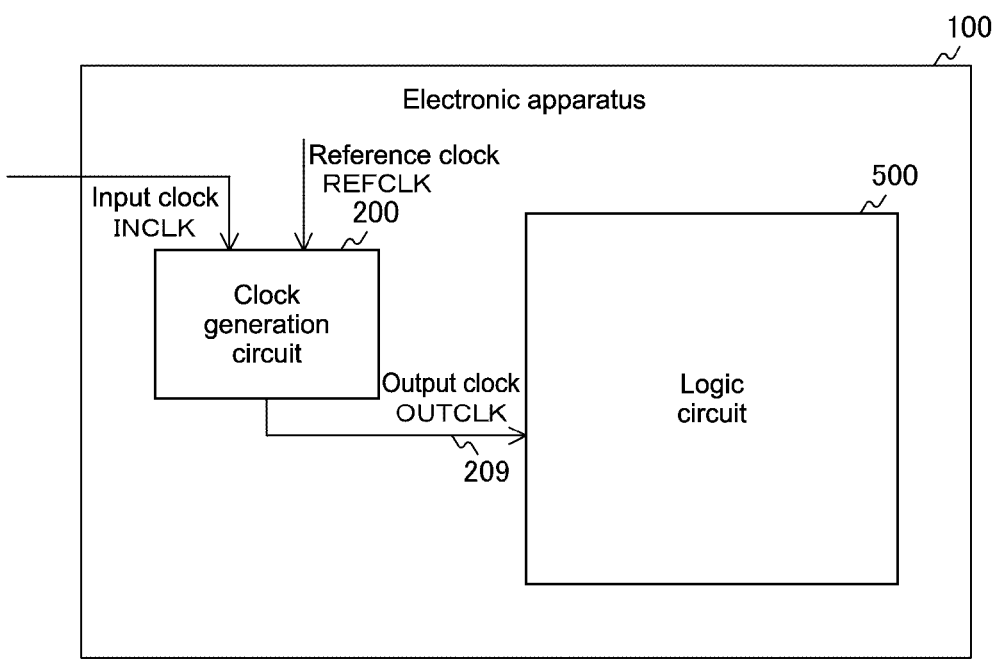
FIG. 1 is a block diagram showing a configuration example of an electronic apparatus according to a first embodiment of the present disclosure.

1. First embodiment (example in which a quantization process is performed on a control signal before a modulation process is performed on the control signal)
2. Second embodiment (example in which a modulation process is performed on a control signal before a quantization process is performed on the control signal)
3. Modified example 1. First Embodiment Configuration Example of Electronic Apparatus FIG. 1 is a block diagram showing a configuration example of an electronic apparatus 100 according to an embodiment of the present disclosure. The electronic apparatus 100 is an apparatus that performs a predetermined process such as an image process, and includes a clock generation circuit 200 and a logic circuit 500. To the electronic apparatus 100, an input clock signal INCLK is input. For example, a horizontal synchronous signal or a vertical synchronous signal is input as the input clock signal INCLK. Moreover, jitter may be caused in the input clock signal INCLK. It should be noted that the jitter represents that the phase of a positive-going edge or a negative-going edge of a clock signal is not at a constant interval but varies.

The clock generation circuit 200 is configured to use a reference clock signal REFCLK having a higher frequency than the input clock signal INCLK to generate an output clock signal OUTCLK in which jitter is reduced. The clock generation circuit 200 is configured to supply the generated output clock signal OUTCLK to the logic circuit 500 via a signal line 209.

The logic circuit 500 is configured to perform a predetermined process such as an audio process, an image process, and a communication process in synchronization with the output clock signal OUTCLK. It should be noted that the logic circuit 500 is an example of an operation circuit according to an embodiment of the present disclosure.

Configuration Example of Clock Generation Circuit

Figure 2:
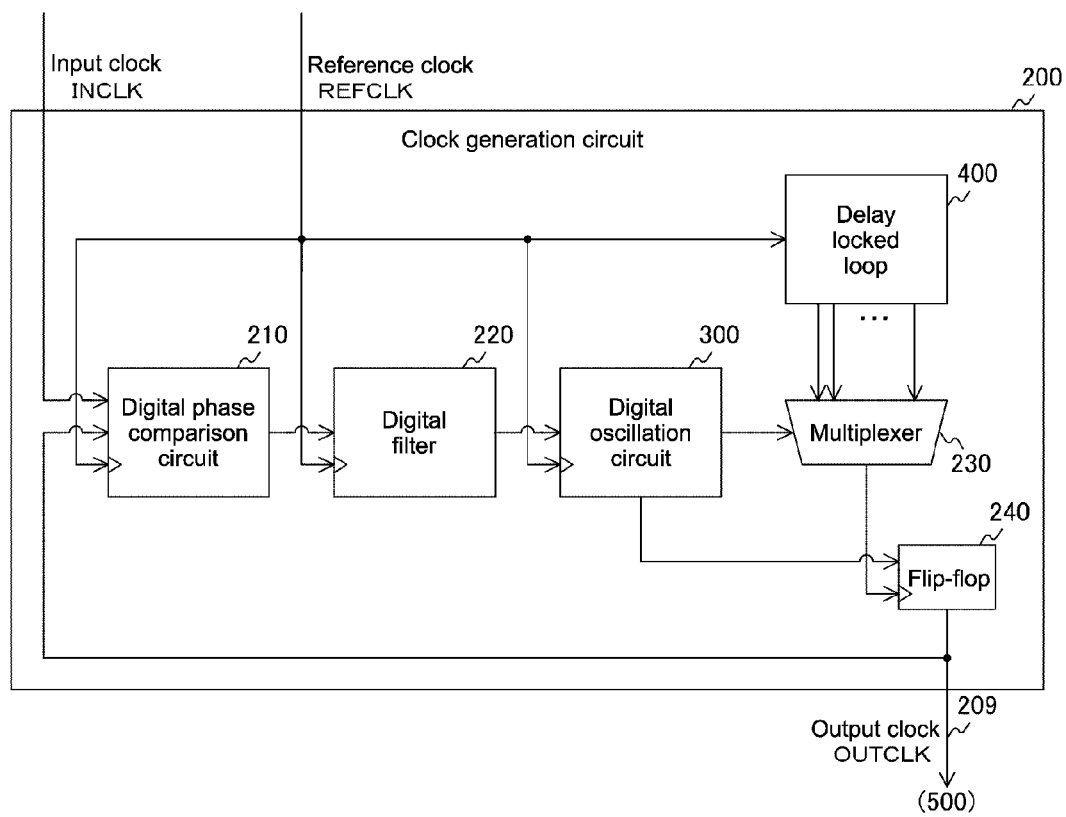
FIG. 2 is a block diagram showing a configuration example of a clock generation circuit according to the first embodiment.

FIG. 2 is a block diagram showing a configuration example of the clock generation circuit 200 according to the first embodiment. The clock generation circuit 200 includes a digital phase comparison circuit 210, a digital filter 220, a multiplexer 230, a flip-flop 240, a digital oscillation circuit 300, and a delay locked loop 400.

The digital phase comparison circuit 210 is configured to compare the phase of the input clock signal INCLK and the phase of the output clock signal OUTCLK, and to detect a phase difference in synchronization with the reference clock signal REFCLK. The digital phase comparison circuit 210 is configured to generate a control signal SLOPE that controls a phase based on the detected phase difference, and to supply the generated control signal SLOPE to the digital filter 220.

The digital filter 220 is configured to perform a process for reducing a noise component in a band of frequencies higher than a predetermined cutoff frequency on the control signal SLOPE. As the digital filter 220, an infinite impulse response (IIR) filter or a finite impulse response (FIR) filter is used, for example. The digital filter 220 is configured to supply the control signal SLOPE in which a high frequency component is reduced to the digital oscillation circuit 300.

The delay locked loop 400 is configured to generate M (M represents an integer of two or more) delay clock signals DLLCLK having different time periods for the reference clock signal REFCLK. The delay locked loop 400 is configured to supply the delay clock signals DLLCLK to the multiplexer 230. It should be noted that the delay locked loop 400 is an example of a delay clock generation unit according to an embodiment of the present disclosure.

The digital oscillation circuit 300 is configured to generate a low-speed clock signal NCOCLK' having a lower frequency than the reference clock signal REFCLK in accordance with the control signal SLOPE, and to supply the generated low-speed clock signal NCOCLK' to the flip-flop 240. Moreover, the digital oscillation circuit 300 is configured to perform a quantization process and a modulation process on the control signal SLOPE. It should be noted that the quantization process is a process for quantizing the control signal SLOPE into M stages of discrete values (e.g., integer), and the modulation process is a process for distributing a quantization error occurred in the quantization process in a band of frequencies higher than a predetermined frequency. The digital oscillation circuit 300 is configured to supply the control signal on which the quantization process and the modulation process are performed to the multiplexer 230 as a control signal DLLTAP'.

It should be noted that at least a part of the high frequency band in which the quantization error is distributed favorably overlaps with the band in which a noise component is removed by the digital filter 22. Accordingly, jitter caused due to the distributed quantization error is removed by the digital filter 220.

The multiplexer 230 is configured to select any one of the M delay clock signals DLLCLK in accordance with the quantized control signal DLLTAP', and to supply the selected delay clock signal DLLCLK to the flip-flop 240. It should be noted that the multiplexer 230 is an example of the selection unit according to an embodiment of the present disclosure.

The flip-flop 240 is configured to hold the low-speed clock signal NCOCLK', and to output the held low-speed clock signal NCOCLK' as the output clock signal OUTCLK in synchronization with the delay clock signals DLLCLK supplied from the multiplexer 230. The output clock signal OUTCLK is supplied to the logic circuit 500 and the digital phase comparison circuit 210. It should be noted that the flip-flop 240 is an example of the output unit according to an embodiment of the present disclosure.

Configuration Example of Digital Oscillation Circuit

Figure 3:
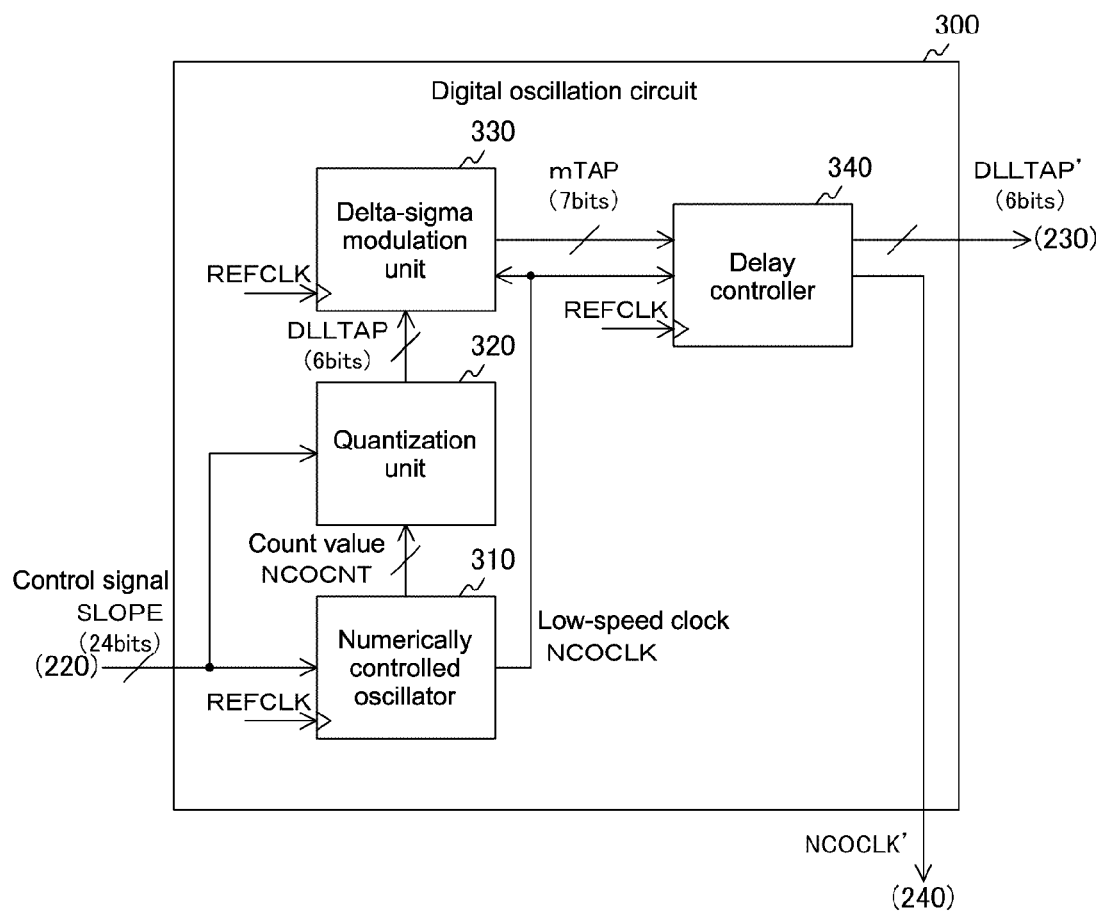
FIG. 3 is a block diagram showing a configuration example of a digital oscillation circuit according to the first embodiment.

FIG. 3 is a block diagram showing a configuration example of the digital oscillation circuit 300 according to the first embodiment. The digital oscillation circuit 300 includes a numerically controlled oscillator 310, a quantization unit 320, a delta-sigma modulation unit 330, and a delay controller 340.

The numerically controlled oscillator 310 is configured to generate a low-speed clock signal NCOCLK in accordance with the control signal SLOPE. The data size of the control signal SLOPE is 24 bits, for example. The numerically controlled oscillator 310 is configured to supply the generated low-speed clock signal NCOCLK to the delta-sigma modulation unit 330 and the delay controller 340. Moreover, the numerically controlled oscillator 310 is configured to generate a count value NCOCNT by integrating the value of the control signal SLOPE in synchronization with the reference clock signal REFCLK, and to supply the generated count value NCOCNT to the quantization unit 320. It should be noted that the numerically controlled oscillator 310 is an example of a low-speed clock generation unit according to an embodiment of the present disclosure.

The quantization unit 320 is configured to use the count value NCOCNT to perform the quantization process on the control signal SLOPE. If the number M of delay clock signals DLLCLK is assumed to be "64" in a decimal number, the control signal SLOPE is quantized into an integer of "0" to "63" in a decimal number in the quantization process, for example. Hereinafter, the integer represents a decimal number unless otherwise described. The quantization unit 320 is configured to supply the quantized signal of 6 bits to the delta-sigma modulation unit 330 as a control signal DLLTAP. It should be noted that although the quantization unit 320 performs quantization into M stages of integers, it is not limited thereto. The quantization unit 320 may perform quantization into M stages of discrete real numbers.

The delta-sigma modulation unit 330 is configured to perform, on the control signal DLLTAP, a delta-sigma modulation process for distributing the quantization error occurred in the quantization process in the high frequency band. The delta-sigma modulation unit 330 is configured to perform a delta-sigma modulation process including a process for integrating the control signal DLLTAP in synchronization with the low-speed clock signal NCOCLK. With the integration, the data size of the control signal increases from 6 bits to 7 bits, for example. The delta-sigma modulation unit 330 is configured to supply the modulated signal to the delay controller 340 as a control signal mTAP.

The delay controller 340 is configured to convert the control signal mTAP of 7 bits into the control signal DLLTAP' of 6 bits, and to delay the converted control signal DLLTAP' as well as the low-speed clock signal NCOCLK. The delay controller 340 is configured to supply the delayed converted control signal DLLTAP' and the low-speed clock signal NCOCLK to the multiplexer 230 and the flip-flop 240 as the control signal DLLTAP' and the low-speed clock signal NCOCLK'. It should be noted that a circuit including the quantization unit 320, the delta-sigma modulation unit 330, and the delay controller 340 is an example of a control signal processing unit according to an embodiment of the present disclosure.

Figure 4:
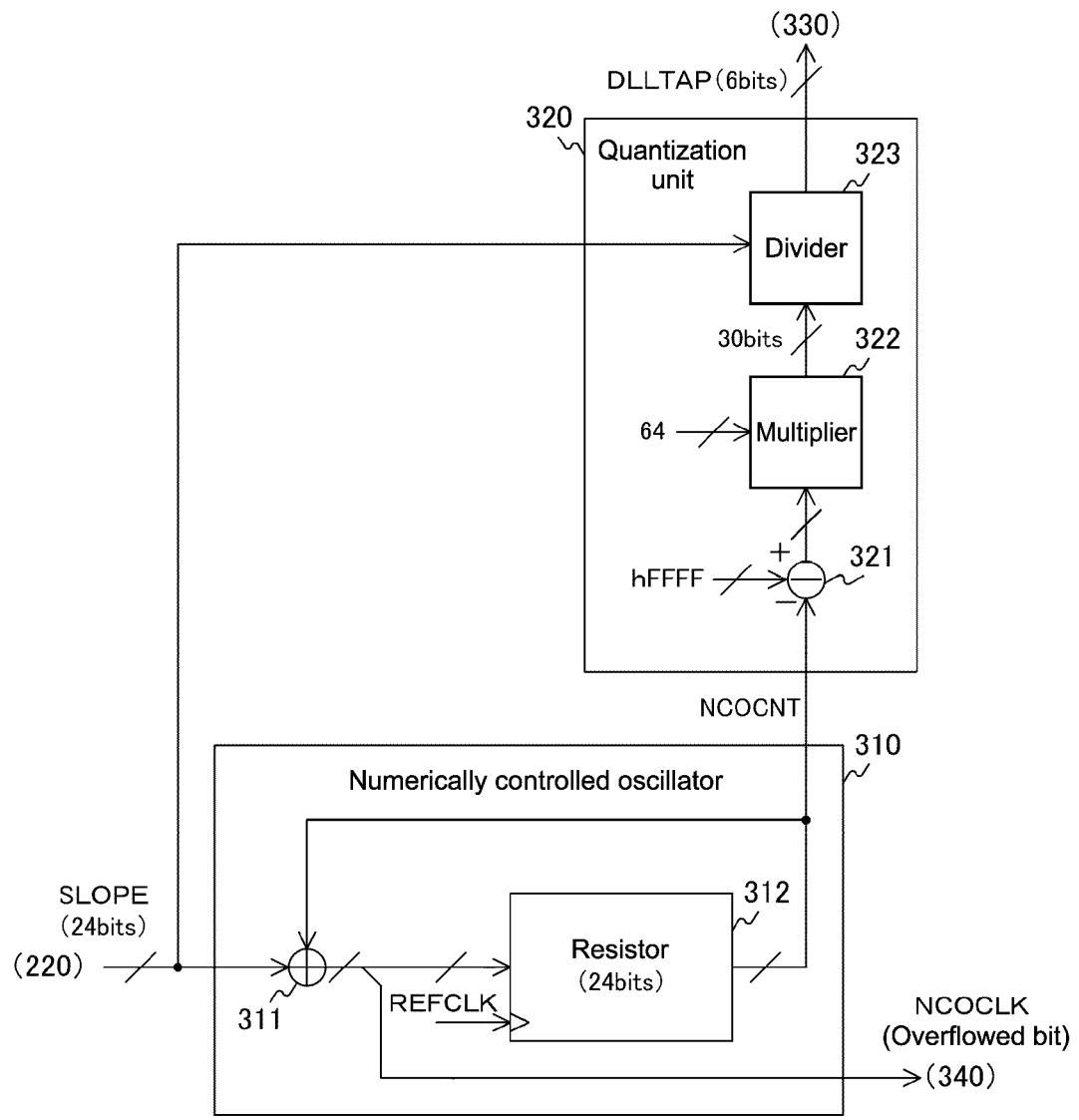
FIG. 4 is a circuit diagram showing a configuration example of a numerically controlled oscillator and a quantization unit according to the first embodiment.

Configuration Example of Numerically Controlled Oscillator and Quantization Unit FIG. 4 is a circuit diagram showing a configuration example the numerically controlled oscillator 310 and the quantization unit 320 according to the first embodiment. The numerically controlled oscillator 310 includes an adder 311 and a resistor 312. Moreover, the quantization unit 320 includes a subtractor 321, a multiplier 322, and a divider 323.

The resistor 312 is configured to hold the count value NCOCNT in synchronization with the reference clock signal REFCLK, and to supply the held count value NCOCNT to the adder 311 and the quantization unit 320. The size of the data held by the resistor 312 is 24 bits, for example. Therefore, the maximum value of the count value NCOCNT is $2^{24}-1$.

The adder 311 is configured to add the value of the control signal SLOPE to the count value NCOCNT supplied from the resistor 312. The adder 311 is configured to update the resistor 312 with the added value. Accordingly, the value of the control signal SLOPE is integrated in synchronization with the reference clock signal REFCLK. Moreover, the adder 311 is configured to supply the signal of overflowed bits, which represents whether or not the integration value exceeds the maximum value ($2^{24}-1$) and is rolled over, to the delta-sigma modulation unit 330 and the delay controller 340 as the low-speed clock signal NCOCLK.

The subtractor 321 is configured to subtract the count value NCOCNT from "FFFF" in a hexadecimal number. The subtractor 321 is configured to supply the subtraction results to the multiplier 322.

The multiplier 322 is configured to multiply the subtraction results obtained from the subtractor 321 by the number M of taps of the delay locked loop 400 (e.g., 64). The multiplier 322 is configured to supply the multiplication results to the divider 323.

The divider 323 is configured to divide the multiplication results obtained from the multiplier 322 by the value of the control signal SLOPE, and to obtain the remainder thereof. The divider 323 is configured to supply the calculated remainder to the delta-sigma modulation unit 330 as the control signal DLLTAP.

By the subtractor 321, the multiplier 322, and the divider 323, rounding calculation in which the phase error in the edge of the low-speed clock signal NCOCLK at a reference timing of a constant interval is rounded into an integer of 0 to M−1 is performed. The phase error is obtained with a real number having higher accuracy than the M stages of discrete values (e.g., integers). An error (quantization error) occurs due to the rounding calculation in which the phase error is rounded into M stages of discrete values.

Configuration Example of Delta-Sigma Modulation Unit

Figure 5:
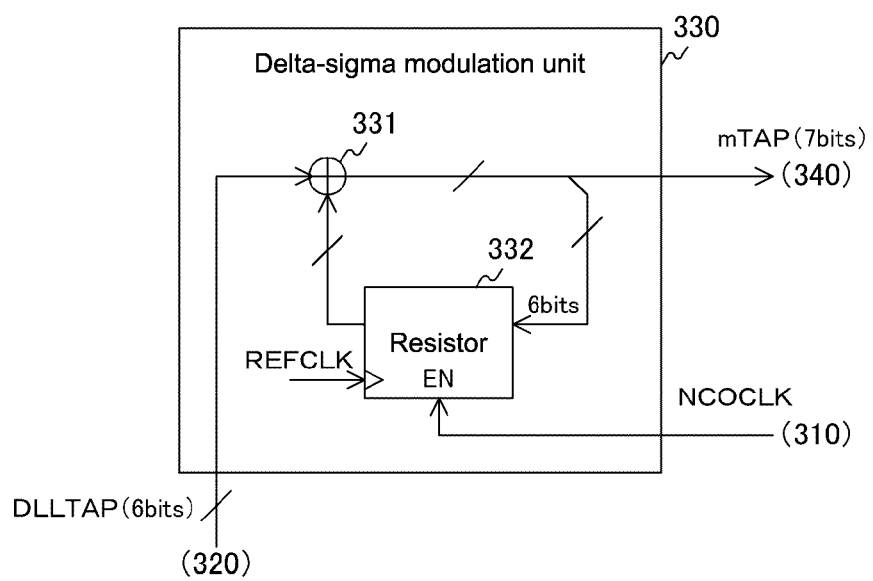
FIG. 5 is a circuit diagram showing a configuration example of a delta-sigma modulation unit according to the first embodiment.

FIG. 5 is a circuit diagram showing a configuration example of the delta-sigma modulation unit 330 according to the first embodiment. The delta-sigma modulation unit 330 includes an adder 331 and a resistor 332.

The resistor 332 is configured to hold lower 6 bits of the control signal mTAP of 7 bits and to supply the held value to the adder 331 in the case where the low-speed clock signal NCOCLK is at a high level.

The adder 331 is configured to add the held value supplied from the resistor 332 to the value of the control signal DLL-TAP supplied from the quantization unit 320, and to supply a signal that represents the added value to the resistor 332 and the delay controller 340 as the control signal mTAP.

By the adder 331 and the resistor 332, the value of the control signal DLLTAP is integrated in synchronization with the low-speed clock signal NCOCLK. Such a process for integrating the signal quantized (in other words, differentiated) previously is called a sigma-delta modulation process. By the sigma-delta modulation process, the quantization error in a low frequency band is distributed in a high frequency band. The properties are called noise shaping properties.

Configuration Example of Delay Controller

Figure 6:
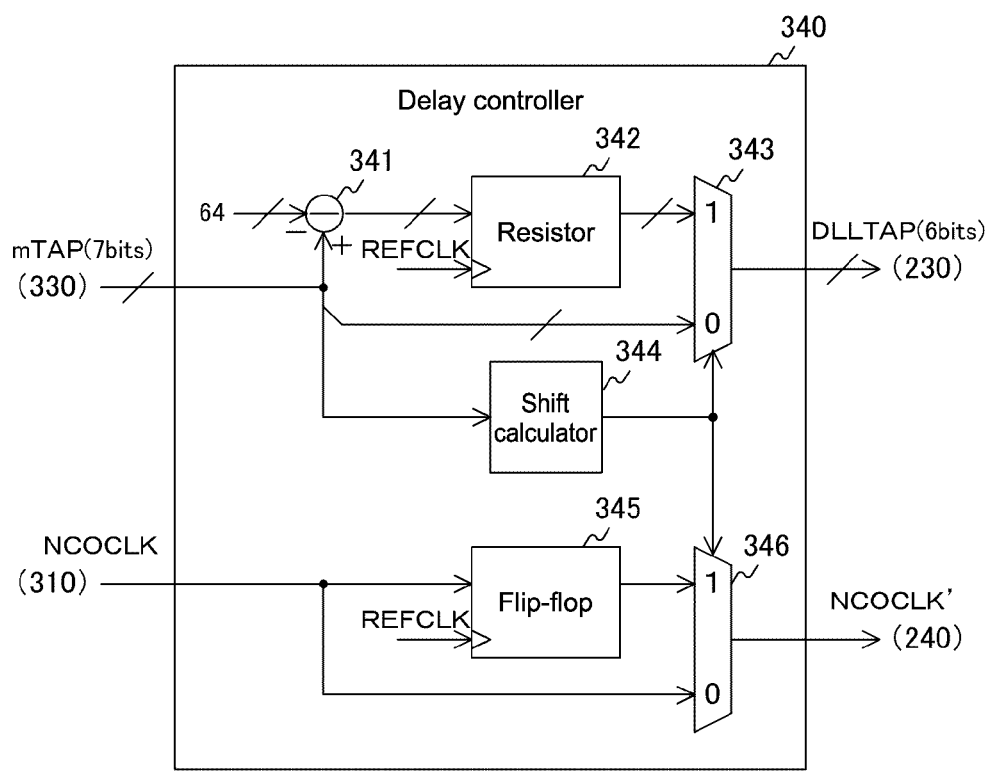
FIG. 6 is a circuit diagram showing a configuration example of a delay controller according to the first embodiment.

FIG. 6 is a circuit diagram showing a configuration example of the delay controller 340 according to the first embodiment. The delay controller 340 includes a subtractor 341, a resistor 342, selectors 343 and 346, a shift a shift calculator 344, and a flip-flop 345.

The subtractor 341 is configured to subtract the value of the control signal mTAP from M (e.g., 64). The subtractor 341 is configured to supply the subtraction results to the resistor 342. The resistor 342 is configured to hold the subtraction results in synchronization with the reference clock signal REFCLK, and to supply the held subtraction results to the selector 343.

The shift calculator 344 is configured to shift the bits of the control signal mTAP to the lower bits by 6 bits, and to supply the shifted control signal mTAP to the selectors 343 and 346.

The selector 343 is configured to select any one of the held value of the resistor 342 and the control signal mTAP based on the value of the shifted control signal mTAP supplied from the shift calculator 344. The selector 343 is configured to select the held value of the resistor 342 in the case where the value of the shifted control signal mTAP is "1." Otherwise, the selector 343 selects the lower 6 bits of the control signal mTAP. The selector 343 is configured to supply the selected signal to the multiplexer 230 as the control signal DLLTAP'.

The flip-flop 345 is configured to hold the low-speed clock signal in synchronization with the reference clock signal REFCLK, and to supply the held low-speed clock signal to the selector 346.

The selector 346 is configured to select any one of the low-speed clock signal NCOCLK delayed by the flip-flop 345 based on the value of the shifted control signal supplied from the shift calculator 344 and the not delayed low-speed clock signal NCOCLK. The selector 343 is configured to select the delayed low-speed clock signal NCOCLK in the case where the value of the shifted control signal is "1," and otherwise select the not-delayed low-speed clock signal NCOCLK. The selector 343 is configured to supply the selected signal to the flip-flop 345 as the low-speed clock signal NCOCLK'.

With the configuration of the delay controller 340, in the case where the value of the control signal mTAP exceeds a predetermined value (the output of the shift calculator 344 is "1"), the value is converted into the difference between the predetermined value and the control signal mTAP, and is delayed in synchronization with the low-speed clock signal NCOCLK and output.

Configuration Example of Delay Locked Loop

Figure 7:
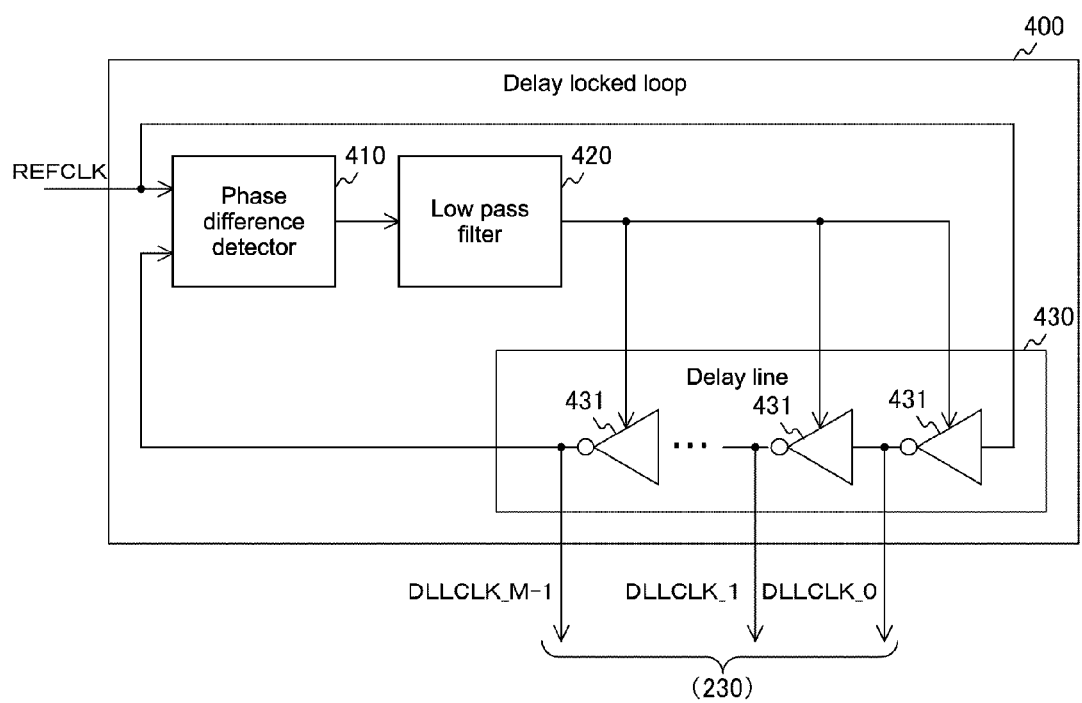
FIG. 7 is a block diagram showing a configuration example of a delay locked loop according to the first embodiment.

FIG. 7 is a block diagram showing a configuration example of the delay locked loop 400 according to the first embodiment. The delay locked loop 400 includes a phase difference detector 410, a low pass filter 420, and a delay line 430. To the delay line 430, a plurality of stages of delay elements 431 are provided.

The phase difference detector 410 is configured to compare the phase of the delay clock signal supplied from the delay element 431 in the final stage and the phase of the reference clock signal REFCLK, and to detect the phase difference. The phase difference detector 410 is configured to supply the voltage signal of the voltage depending on the detected phase difference to the low pass filter 420. The respective delay time periods of the delay elements 431 are controlled by the voltage signal.

The low pass filter 420 is configured to reduce a high frequency component higher than a predetermined cutoff frequency in the phase difference signal supplied from the phase difference detector 410. The low pass filter 420 is configured to supply the voltage signal whose high frequency component is reduced to the respective delay elements 431.

The delay elements 431 is configured to delay the signal input from the delay element 431 in the front stage by the delay time period depending on the voltage signal supplied from the low pass filter 420, and to supply the delayed signal to the delay element 431 in the back stage as the delay clock signals DLLCLK. The reference clock signal REFCLK is input to the delay element 431 in the first stage, and the delay clock signals DLLCLK supplied from the delay element 431 in the final stage is supplied to the phase difference detector 410. As the delay element 431, an inverter is used, for example. Moreover, the respective delay elements 431 are configured to supply the delay clock signal DLLCLK also to the multiplexer 230. The number of stages (taps) of the delay elements 431 is M. Hereinafter, signals generated by the delay elements 431 are referred to as delay clock signals DLLCLK_0 to DLLCLK_M−1.

Figure 8:
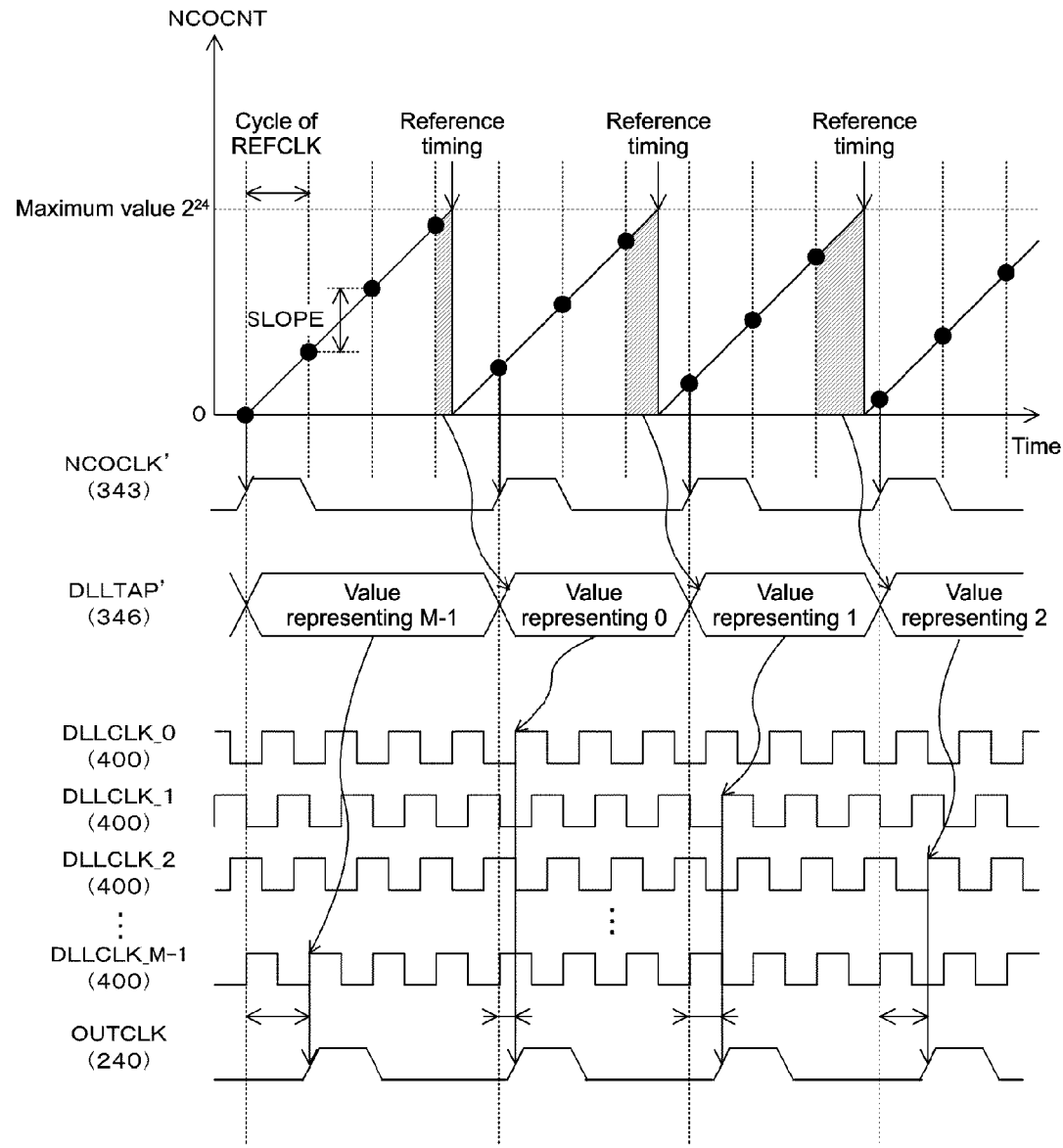
FIG. 8 is a timing chart showing an exemplary operation of the clock generation circuit according to the first embodiment.

FIG. 8 is a timing chart showing an example of the operation of the clock generation circuit 200 according to the first embodiment. The vertical axis in FIG. 8 represents the count value NCOCNT of the numerically controlled oscillator 310 in the clock generation circuit 200, and the horizontal axis represents time.

The numerically controlled oscillator 310 is configured to integrate the value of the control signal SLOPE in synchronization with the reference clock signal REFCLK. Here, if jitter is not caused in the input clock signal INCLK, the interval of the timing when the integration value of the control signal SLOPE (NCOCNT) is overflowed is constant. Hereinafter, the ideal edge position is referred to as "reference timing."

The digital oscillation circuit 300 is configured to perform the quantization process and the modulation process on the control signal SLOPE. As a result, a control signal DLLTAP' quantized into M stages of discrete values is output from the selector 343 in the digital oscillation circuit 300.

Moreover, in the case where the quantization error does not occur, the low-speed clock signal NCOCLK' is output at the timing when the count value NCOCNT is overflowed.

On the other hand, the delay locked loop 400 is configured to generate the delay clock signals DLLCLK having different delay time periods, and the flip-flop 240 is configured to output the low-speed clock signal NCOCLK' as the output clock signal OUTCLK in synchronization with the control signal DLLTAP'.

As described above, the clock generation circuit 200 is configured to perform retiming with any one of the M delay clock signals DLLCLK, and to output the clock signal OUTCLK. Accordingly, the phase of the clock signal OUTCLK can be controlled by the phase resolution depending on the number M of the delay clock signals DLLCLK.

Figure 9:
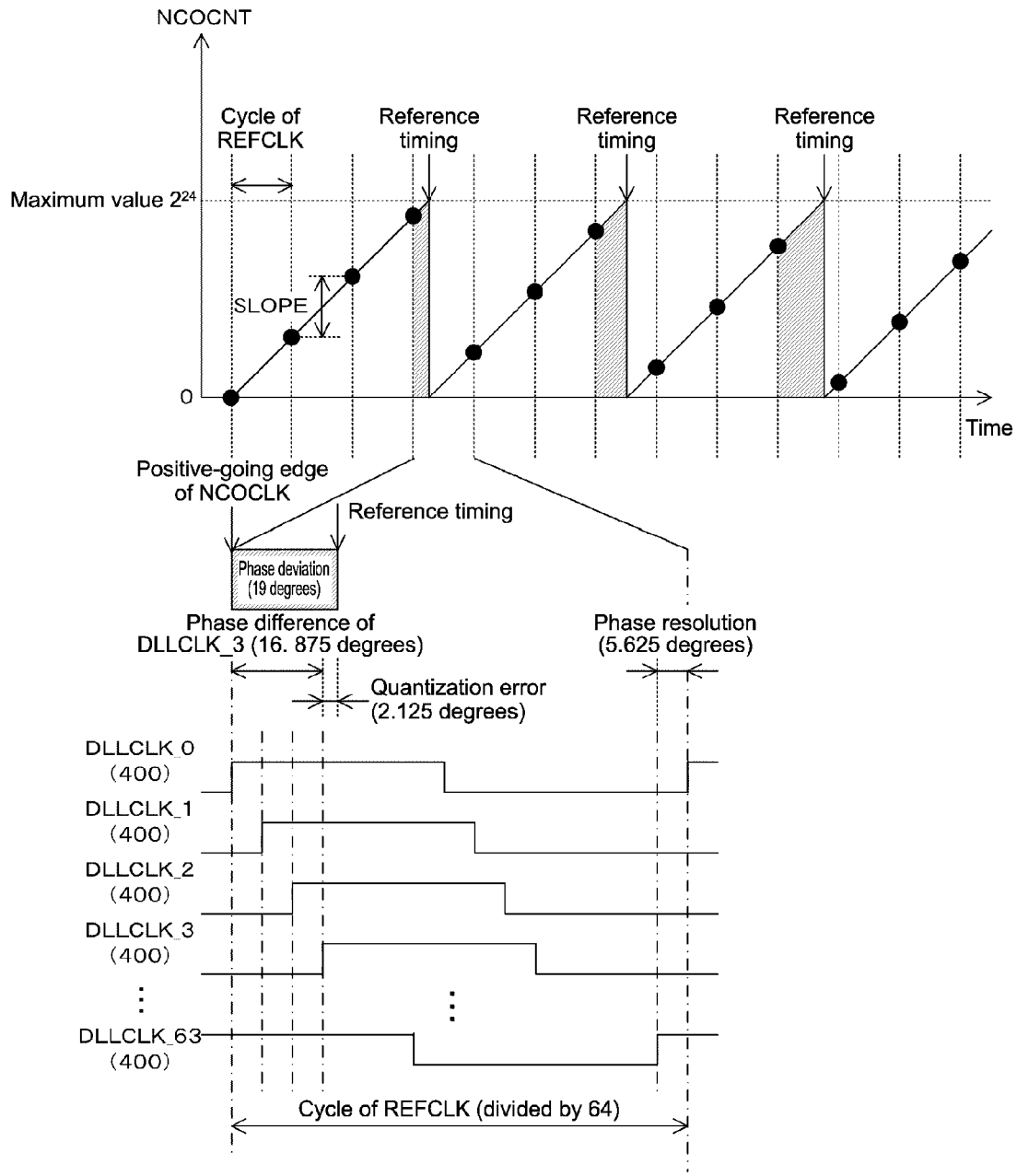
FIG. 9 is a diagram for explaining a quantization error according to the first embodiment.

FIG. 9 is a diagram for explaining the quantization error according to the first embodiment. The clock generation circuit 200 is configured to perform rounding calculation in which the deviation of the edge of the low-speed clock signal NCOCLK with respect to the reference timing of a constant interval is rounded into M stages of discrete values. The phase deviation is obtained with accuracy higher than the M stages of discrete values. Calculation in which the phase deviation is rounded into discrete values with lower accuracy causes a rounding error being a kind of the quantization error.

For example, in the case where the number M of delay clock signals DLLCLK is 64, the clock generation circuit 200 can correct the phase deviation with the phase resolution of 5.625 degrees obtained by dividing 360 degrees by 64 degrees. When the phase deviation is 19 degrees, an integer "3" that represents the DLLCLK_3, which has the closest phase difference to the 19 degrees, is calculated by the rounding calculation. In the calculation, because the phase difference of the DLLCLK_3 is 16.875 degrees, 2.125 degrees, which is the difference between 16.875 degrees and 19 degrees being the actual value, remains as the quantization error. The quantization error is a cause of jitter in the output clock signal OUTCLK.

Figure 10A:
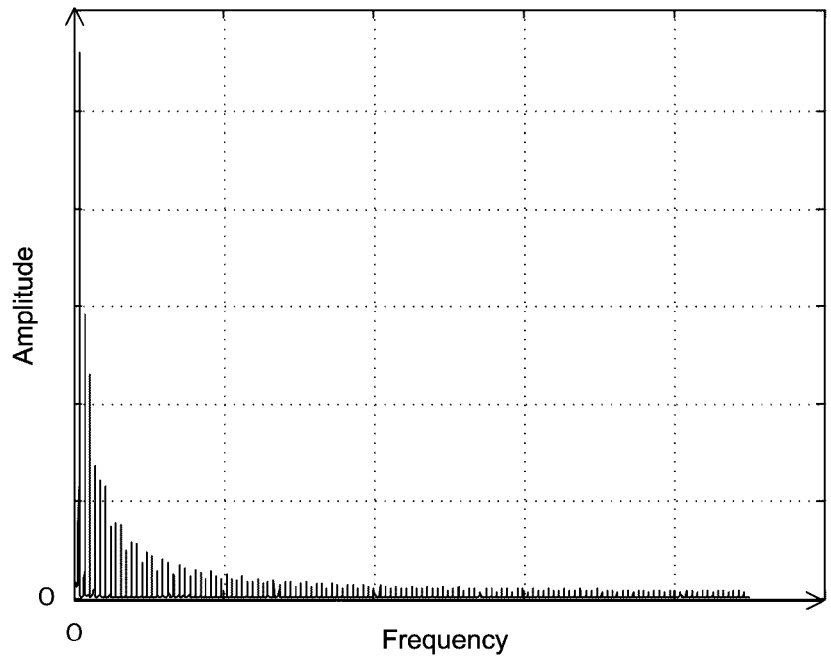
FIGS. 10A and 10B are each a diagram showing an example of frequency properties of jitter according to the first embodiment.
Figure 10B:
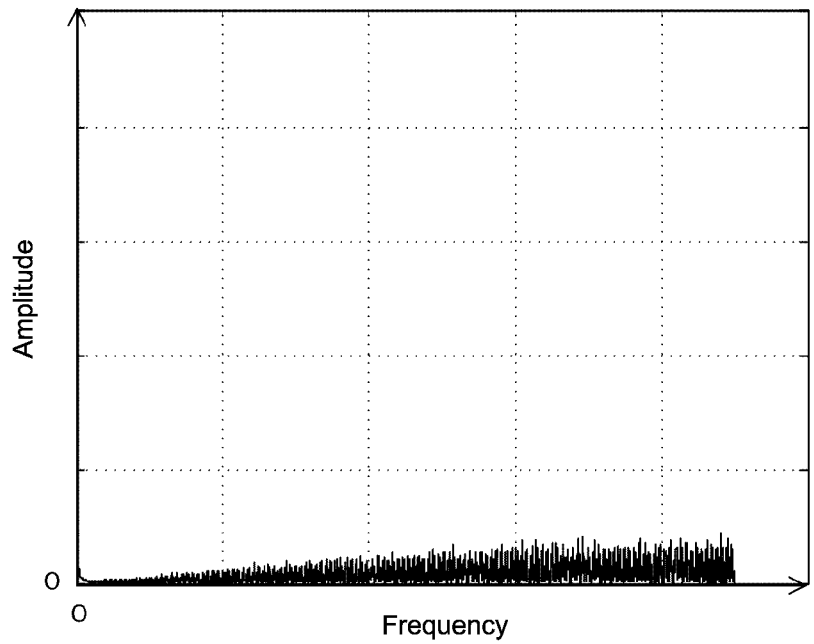

FIG. 10 are each a diagram showing an example of frequency properties of jitter according to the first embodiment. In FIG. 10, the vertical axis represents an amplitude of jitter and the horizontal axis represents a frequency of the jitter. FIG. 10A shows frequency properties of the jitter according to a comparative example in the case where the sigma-delta modulation process is not performed. FIG. 10B shows frequency properties of the jitter in the case where the sigma-delta modulation process is performed.

As shown in FIG. 10A, in the case where the modulation process is not performed, jitter is caused due to the quantization error. For example, in the case where the numerically controlled oscillator is used to generate a clock signal, because lower values are held when overflow occurs, feedback of the phase error is provided. As a result, if the constant control signal SLOPE is input to the numerically controlled oscillator, jitter is caused particularly in a low frequency band, as shown in FIG. 10A.

On the other hand, in the case where the sigma-delta modulation process is performed, because the quantization error is distributed in a high frequency band, jitter caused in a low frequency band is pushed toward the high frequency band, as shown in FIG. 10B. Accordingly, jitter is reduced in the output clock signal OUTCLK.

Figure 11:
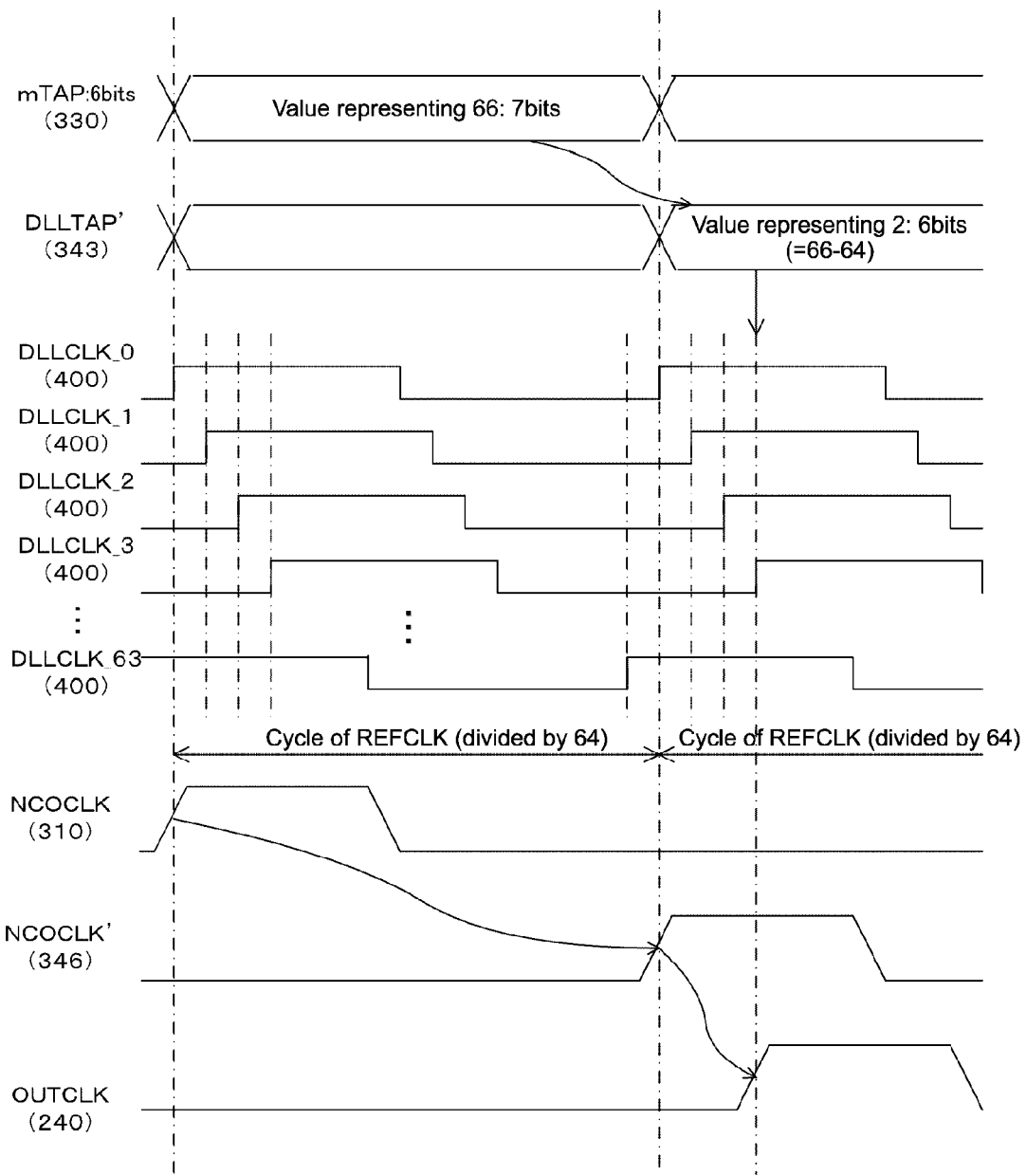
FIG. 11 is a timing chart showing an example of delay control performed by the clock generation circuit according to the first embodiment.

FIG. 11 is a timing chart showing an example of delay control by the clock generation circuit 200 according to the first embodiment. In the case where the sigma-delta modulation process is performed after the quantization process, the data size of the control signal increases from 6 bits to 7 bits by the integration in the sigma-delta modulation process. In the case where the phase control is performed by the control signal of 6 bits in the cycle of the reference clock signal REFCLK, the clock generation circuit 200 performs phase control in an amount corresponding to one cycle of the reference clock signal REFCLK, and in an amount that exceeds 6 bits after the control signal and the low-speed clock signal are delayed.

For example, in the case where the value of the control signal mTAP of 7 bits after the modulation is "66," the value of the control signal is replaced with "2" being the difference between the "66" and "64." Then, the selector 343 delays the control signal and outputs the delayed control signal as the control signal DLLTAP' in synchronization with the reference clock signal REFCLK. Moreover, the selector 346 delays the low-speed clock signal NCOCLK in synchronization with the reference clock signal REFCLK, and outputs the delayed low-speed clock signal NCOCLK as the low-speed clock signal NCOCLK'.

Then, the delay clock signals DLLCLK_2 is selected in accordance with the control signal DLLTAP', and the flip-flop 240 outputs the low-speed clock signal NCOCLK' as the output clock signal OUTCLK in synchronization with the delay clock signals DLLCLK_2. Accordingly, the phase error of the amount that is not able to be corrected in the cycle of the reference clock signal REFCLK ("2") is corrected in the next cycle.

As described above, according to the first embodiment of the present disclosure, because the clock generation circuit 200 performs the quantization process on the control signal before performing the modulation process on the control signal, it is possible to distribute the quantization error in a high frequency band and to reduce jitter caused due to the quantization error.

2. Second Embodiment

In the first embodiment, the digital oscillation circuit 300 performs the quantization process before performing the modulation process. However, the modulation process may be performed before performing the quantization process. Moreover, in the first embodiment, the numerically controlled oscillator 310 generates the low-speed clock signal. However, a variable divider may generate the low-speed clock signal. The second embodiment is different from the first embodiment in that the digital oscillation circuit 300 according to the second embodiment performs the modulation process before performing the quantization process, and the variable divider generates the low-speed clock signal.

Figure 12:
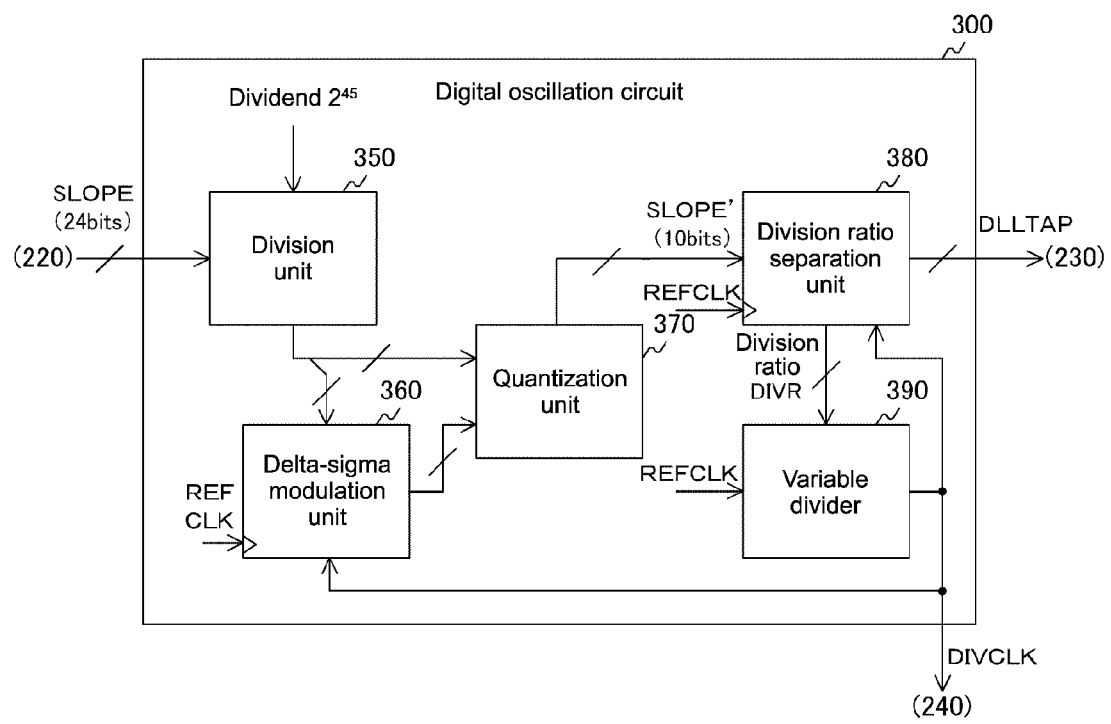
FIG. 12 is a block diagram showing a configuration example of a digital oscillation circuit according to a second embodiment of the present disclosure.

FIG. 12 is a block diagram showing a configuration example of the digital oscillation circuit 300 according to the second embodiment. The digital oscillation circuit 300 according to the second embodiment includes a division unit 350, a delta-sigma modulation unit 360, a quantization unit 370, a division ratio separation unit 380, and a variable divider 390.

The division unit 350 is configured to divide a predetermined dividend $2^{45}$ by the control signal SLOPE. The division unit 350 is configured to replace the value of the control signal SLOPE with the quotient obtained by the division, and to supply the replaced value to the quantization unit 370. Moreover, a part of the control signal SPOLE replaced with the quotient is supplied to the delta-sigma modulation unit 360.

The delta-sigma modulation unit 360 is configured to perform the delta-sigma modulation process on a part of the control signal SLOPE. The delta-sigma modulation unit 360 is configured to supply the modulated signal to the quantization unit 370.

The quantization unit 370 is configured to perform the quantization process on the control signal on which the delta-sigma modulation process has been performed. The quantization unit 370 is configured to supply the quantized signal to the division ratio separation unit 380 as the control signal SLOPE'.

The division ratio separation unit 380 is configured to separate the quantized control signal SLOPE' into a division ratio DIVR and the control signal DLLTAP. The division ratio separation unit 380 is configured to supply the separated division ratio DIVR to the variable divider 390, and to supply the control signal DLLTAP to the multiplexer 230.

The variable divider 390 is configured to divide the reference clock signal REFCLK with the division ratio DIVR. The variable divider 390 is configured to supply the divided clock signal to the division ratio separation unit 380, the delta-sigma modulation unit 360, and the flip-flop 240 as a low-speed clock signal DIVCLK.

Figure 13:
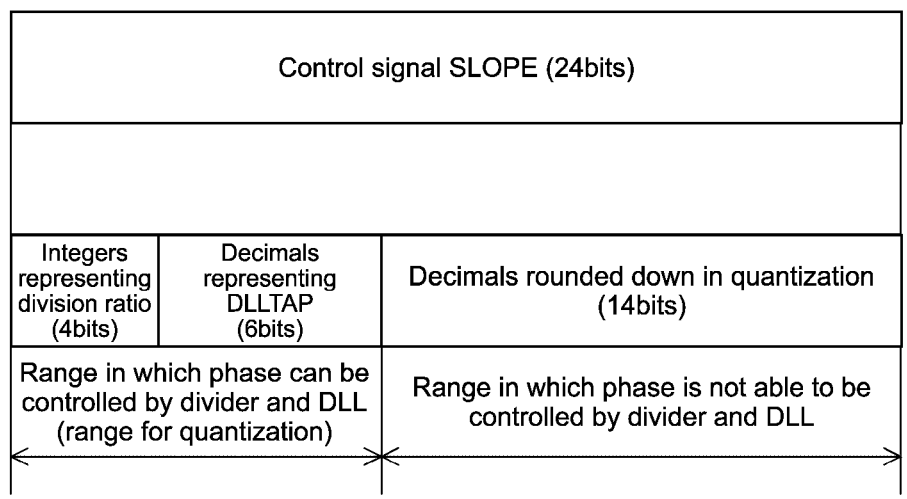
FIG. 13 is a diagram showing an example of the data configuration of a control signal according to the second embodiment.

FIG. 13 is a diagram showing an example of the data configuration of the control signal SLOPE according to the second embodiment. The control signal SLOPE is data of 24 bits in a fixed-point number whose higher 4 bits represent integers, for example. Then, the higher 4 bits of the control signal SLOPE represent the division ratio. Moreover, higher 6 bits of decimals represent the control signal DLLTAP. The 10 bits represent the range in which the phase can be controlled by the variable divider 390 and the delay locked loop 400.

On the other hand, lower 14 bits represent decimals that are rounded down in the quantization, and the range in which the phase is not able to be controlled by the variable divider 390 and the delay locked loop 400. In the range, the quantization error occurs. The sigma-delta modulation process is performed in the range, and lower 2 bits of the division ratio and the control signal DLLTAP of 6 bits are fluctuated by the modulation process, for example.

Figure 14:
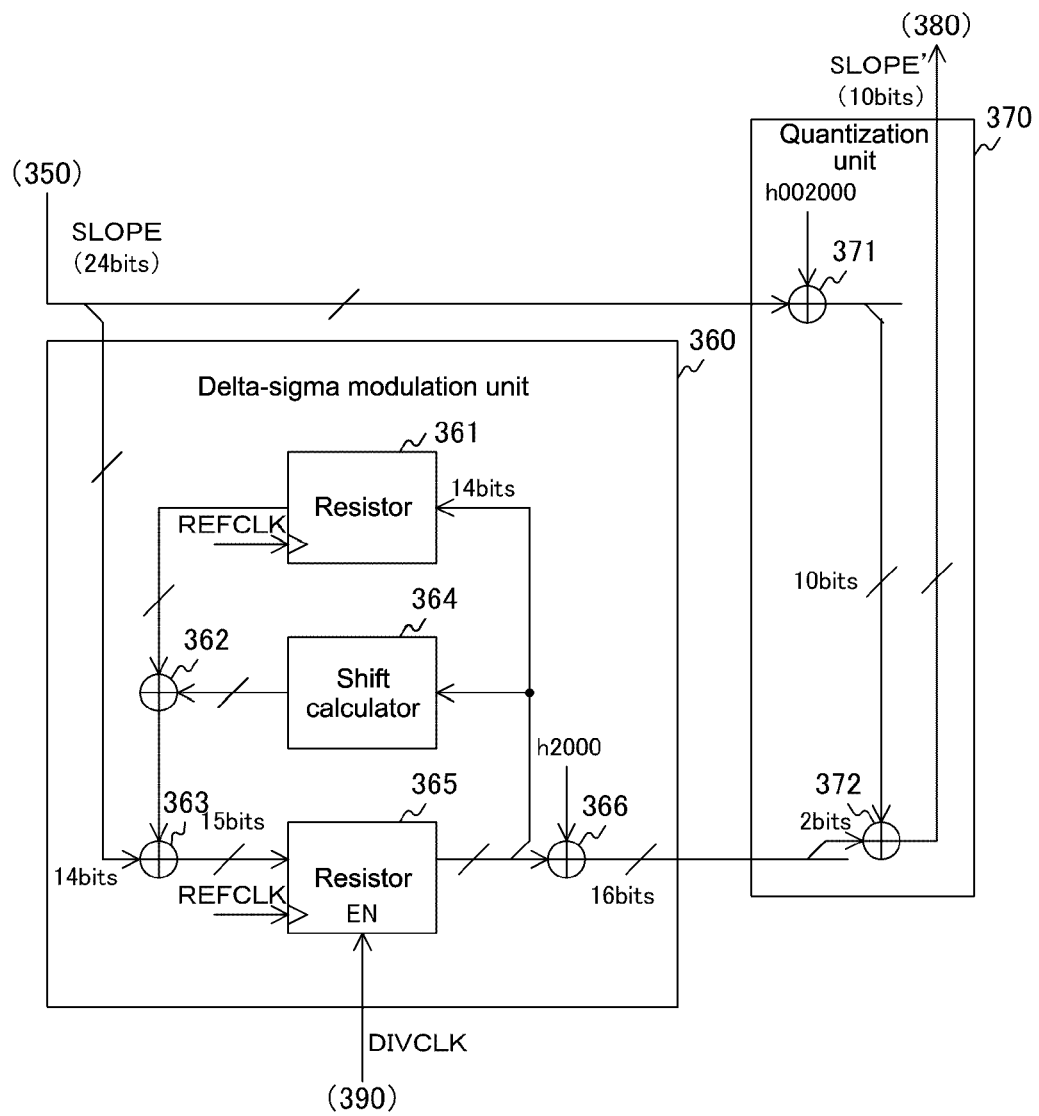
FIG. 14 is a circuit diagram showing a configuration example of a delta-sigma modulation unit and a quantization unit according to the second embodiment.

FIG. 14 is a circuit diagram showing a configuration example of the delta-sigma modulation unit 360 and the quantization unit 370 according to the second embodiment. The delta-sigma modulation unit 360 includes resistors 361 and 365, adders 362, 363, and 366, and a shift calculator 364. Moreover, the quantization unit 370 includes adders 371 and 372.

The adder 363 in the delta-sigma modulation unit 360 is configured to add the addition results obtained from the adder 362 to lower 14 bits of the control signal SLOPE of 24 bits. The adder 363 is configured to supply the addition results of 15 bits to the resistor 365.

The resistor 365 is configured to hold the addition results obtained from the adder 363 and to supply the held addition results to the adder 366 in the case where the low-speed clock signal DIVCLK is at a high level. Moreover, lower 14 bits of the held value of the resistor 365 are supplied to the shift calculator 364 and the resistor 361.

The resistor 361 is configured to hold the signal of 14 bits supplied from the resistor 365 in synchronization with the reference clock signal REFCLK, and to supply the held signal to the adder 362. The shift calculator 364 is configured to shift the signal of 14 bits supplied from the resistor 365 to the higher bits by 2 bits, and to supply the shifted signal to the adder 362.

The adder 362 is configured to add the held value supplied from the resistor 361 and the calculation results obtained from the shift calculator 364. The adder 362 is configured to supply the addition results to the adder 363.

The adder 366 is configured to add "2000" in a hexadecimal number to the held value supplied from the resistor 365. The adder 366 is configured to supply the addition results to the quantization unit 370.

Moreover, the adder 371 in the quantization unit 370 is configured to add "002000" in a hexadecimal number to the control signal SLOPE. The adder 371 is configured to supply higher 10 bits of the addition results to the adder 372. The adder 372 is configured to add higher 2 bits of the calculation results obtained from the adder 366 and the calculation results obtained from the adder 371. The adder 372 is configured to supply the addition results to the division ratio separation unit 380 as the control signal SLOPE'.

By the delta-sigma modulation unit 360, a secondary sigma-delta modulation process is performed on the lower 14 bits of the control signal SLOPE (range in which the quantization error occurs). Then, in the quantization unit 370, lower 14 bits of the control signal SLOPE of 24 bits are rounded down and quantized into the control signal SLOPE' of 10 bits.

Figure 15:
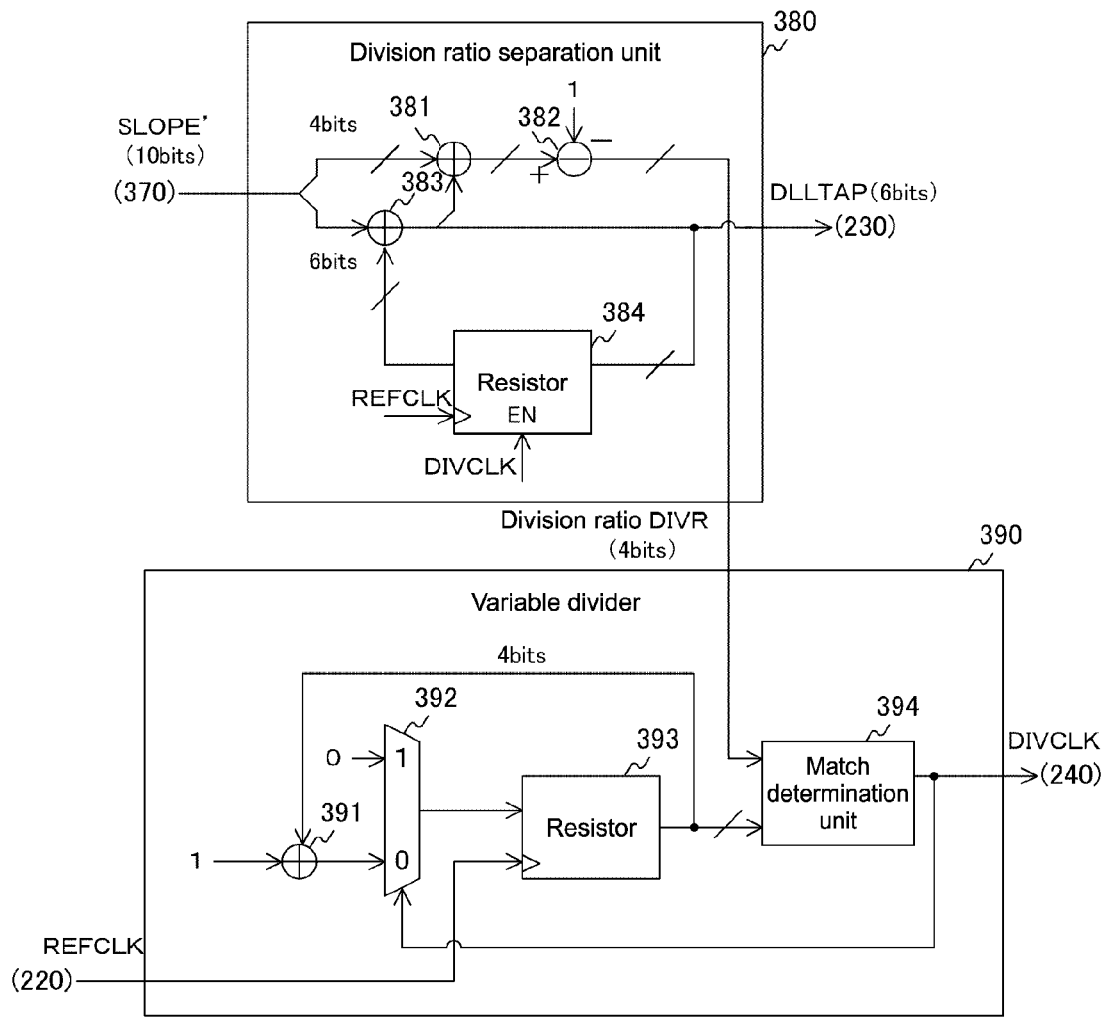
FIG. 15 is a circuit diagram showing a configuration example of a division ratio separation unit and a variable divider according to the second embodiment.

FIG. 15 is a circuit diagram showing a configuration example of the division ratio separation unit 380 and the variable divider 390 according to the second embodiment. The division ratio separation unit 380 includes adders 381 and 383, a subtractor 382, and a resistor 384. Moreover, the variable divider 390 includes an adder 391, a selector 392, a resistor 393, and a match determination unit 394.

The adder 381 in the division ratio separation unit 380 is configured to add a higher 1 bit of the calculation results obtained from the adder 383 to higher 4 bits of the control signal SLOPE'. The adder 381 is configured to supply the addition results to the subtractor 382. The subtractor 382 is configured to subtract "1" from the calculation results obtained from the adder 381, and to supply the subtraction results to the match determination unit 394.

The adder 383 is configured to add the held value of the resistor 384 to lower 6 bits of the control signal SLOPE'. The adder 383 is configured to supply the addition results to the multiplexer 230 as the control signal DLLTAP. Moreover, the highest bit of the calculation results is supplied to the adder 381.

Moreover, the adder 391 in the variable divider 390 is configured to add "1" to the held value of the resistor 393, and to supply the addition results to the selector 392.

The selector 392 is configured to select the value of "0" in the case where the low-speed clock signal DIVCLK obtained from the match determination unit 394 is "1," and otherwise selects the addition results obtained from the adder 391. The selector 392 is configured to cause the resistor 393 to hold the selected signal.

The resistor 393 is configured to hold a signal obtained from the selector 392 and to supply the held value to the match determination unit 394 and the adder 391 in the case where the low-speed clock signal DIVCLK is at a high level.

The match determination unit 394 is configured to determine whether or not the subtraction results obtained from the subtractor 382 match the held value obtained from the resistor 393. The match determination unit 394 is configured to supply the determination results to the resistor 384, the selector 392, and the flip-flop 240 as the low-speed clock signal DIVCLK.

By the division ratio separation unit 380, the control signal SLOPE is separated into the control signal DLLTAP and the division ratio DIVR. Moreover, in the variable divider 390, the reference clock signal REFCLK is divided by the division ratio DIVR, and the divided signal is output as the low-speed clock signal DIVCLK.

As described above, according to the second embodiment of the present disclosure, because the modulation process is performed on the control signal before performing the quantization process on the control signal, it is possible to distribute the quantization error in a high frequency band, and to reduce jitter caused due to the quantization error. Moreover, there is no need to provide the delay controller 340 unlike the first embodiment.

3. Modified Example

In the second embodiment, the digital oscillation circuit 300 performs the quantization or division using a plurality of adders or subtractor. However, it is possible to reduce a part of the adders and subtractor. The digital oscillation circuit 300 according to the modified example of the second embodiment is different from that in the second embodiment in that a part of the adders or subtractor is removed.

Figure 16:
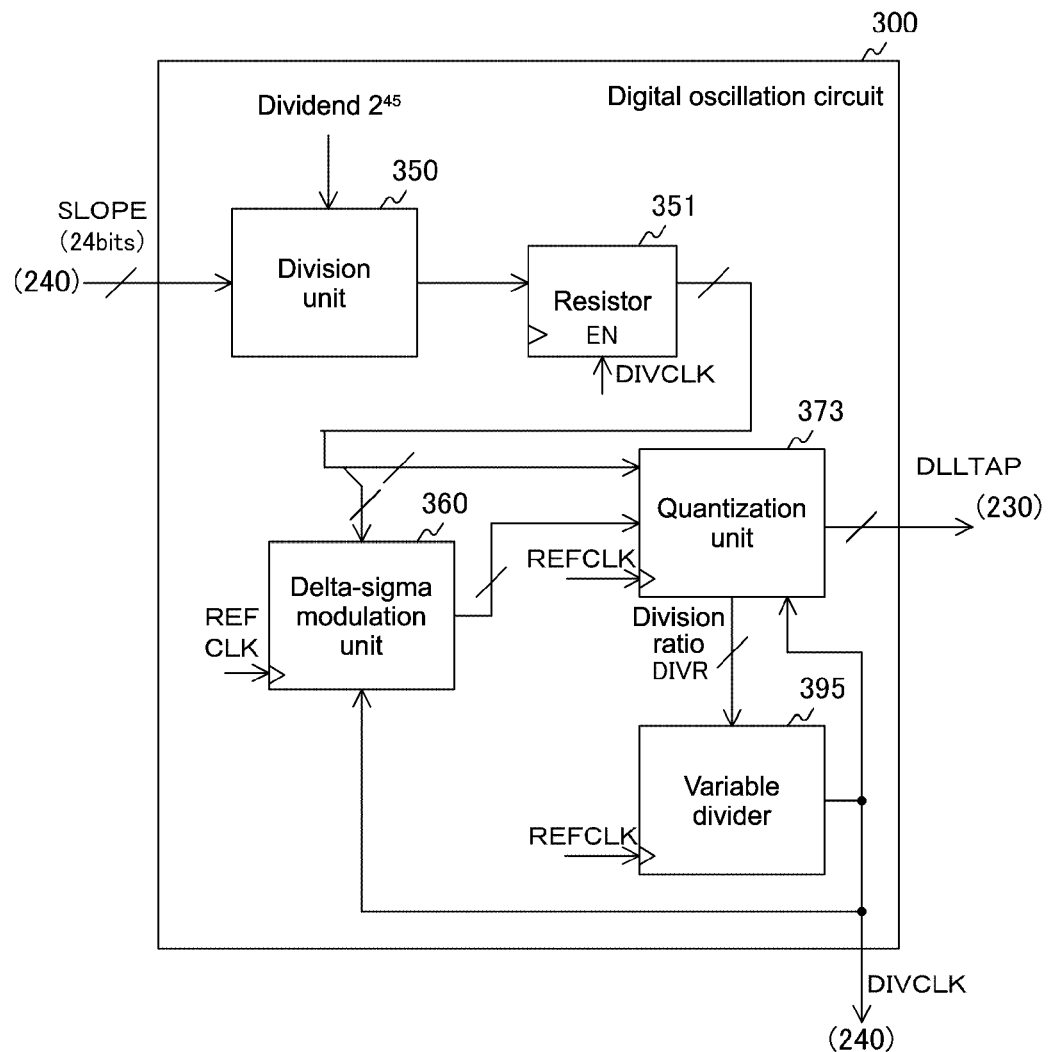
FIG. 16 is a block diagram showing a configuration example of a digital oscillation circuit according to a modified example of the second embodiment.

FIG. 16 is a block diagram showing a configuration example of the digital oscillation circuit 300 according to the modified example of the second embodiment. The digital oscillation circuit 300 according to the modified example is different from that in the second embodiment in that the digital oscillation circuit 300 includes a resistor 351, a quantization unit 373, and a variable divider 395 instead of the quantization unit 370, the division ratio separation unit 380, and the variable divider 390.

The resistor 351 is configured to hold the control signal SLOPE supplied from the division unit 350 and to supply the held control signal SLOPE to the quantization unit 373 in the case where the low-speed clock signal DIVCLK is at a high level. Moreover, lower 14 bits of the control signal SLOPE held in the resistor 351 are supplied to the delta-sigma modulation unit 360.

The quantization unit 373 is configured to perform the quantization process on the control signal on which the delta-sigma modulation process has been performed, and to separate the processed control signal into the division ratio DIVR and the control signal DLLTAP. The division ratio separation unit 380 is configured to supply the separated division ratio DIVR to the variable divider 395, and to supply the control signal DLLTAP to the multiplexer 230.

Figure 17:
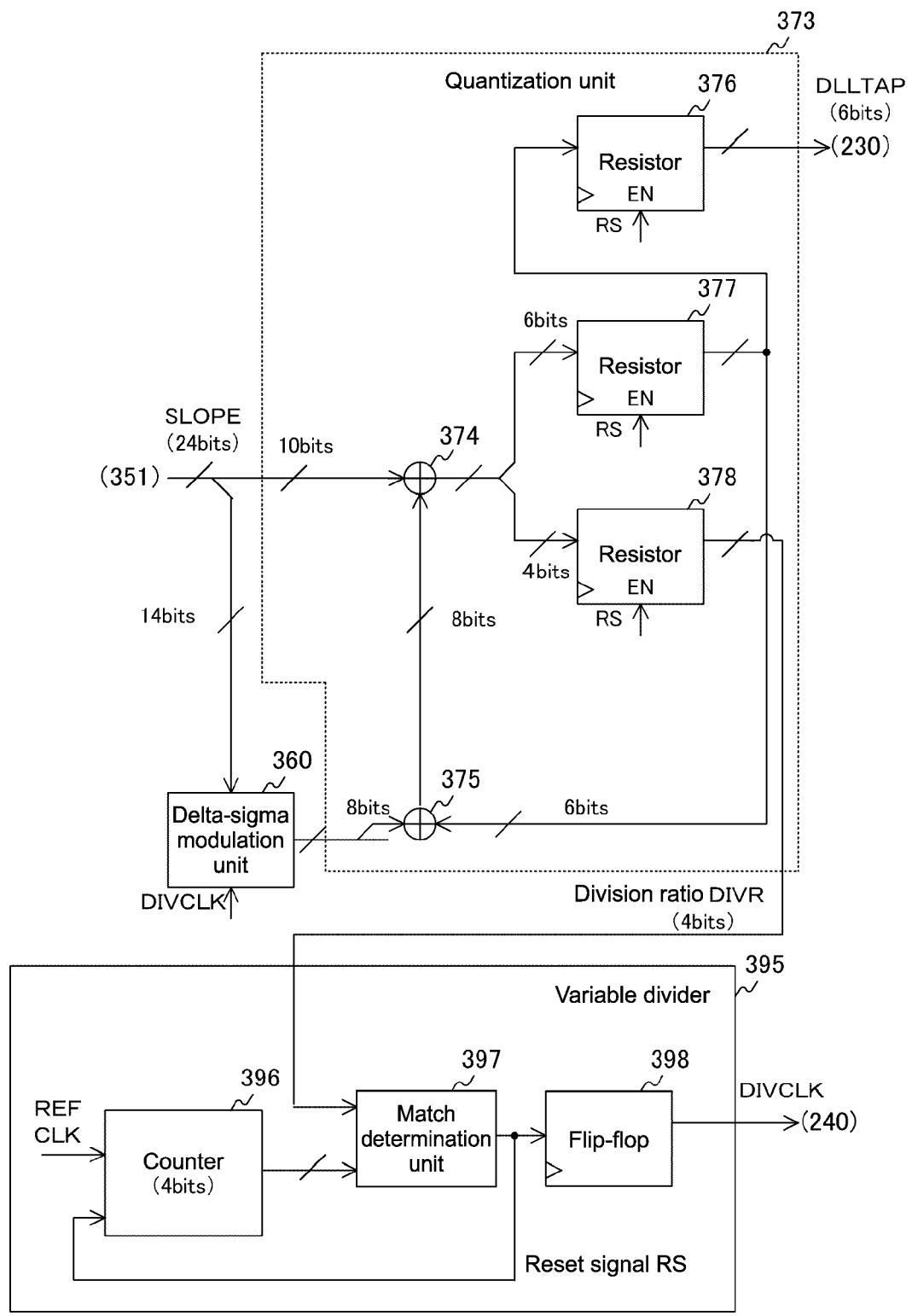
FIG. 17 is a circuit diagram showing a configuration example of a division ratio separation unit and a variable divider according to the modified example of the second embodiment.

FIG. 17 is a circuit diagram showing a configuration example of the quantization unit 373 and the variable divider 395 according to the modified example of the second embodiment. The quantization unit 373 includes adders 374 and 375, and resistors 376, 377, and 378. Moreover, the variable divider 395 includes a counter 396, a match determination unit 397, and a flip-flop 398.

In the quantization unit 373, the adder 374 is configured to add the addition results obtained from the adder 375 to higher 10 bits of the control signal SLOPE.

The resistor 377 is configured to hold lower 6 bits of the addition results obtained from the adder 374 and to supply the held value to the resistor 376 and the adder 375 in the case where a reset signal RS obtained from the variable divider 395 is at a high level.

The resistor 376 is configured to hold a signal obtained from the resistor 377 and to supply the held signal to the multiplexer 230 as the control signal DLLTAP in the case where the reset signal RS is at a high level.

The resistor 378 is configured to hold higher 4 bits of the addition results of the adder 374 and to supply the held value to the match determination unit 397 as the division ratio DIVR in the case where the reset signal RS is at a high level.

The adder 375 is configured to add the held value obtained from the resistor 376 to higher 8 bits of the signal obtained from the delta-sigma modulation unit 360. The adder 375 is configured to supply the addition results of 8 bits to the adder 374.

Moreover, in the variable divider 395, the counter 396 is configured to count the count value of 4 bits in synchronization with the reference clock signal REFCLK, and to supply the count value to the match determination unit 397. Moreover, the counter 396 is configured to initialize the count value to an initial value (e.g., "0") in the case where the reset signal RS obtained from the match determination unit 397 is "1."

The match determination unit 397 is configured to determine whether or not the division ratio DIVR obtained from the resistor 378 matches the counter value obtained from the counter 396. The match determination unit 397 is configured to supply the determination results to the counter 396, the resistors 376, 377, and 378, and the flip-flop 398 as the reset signal RS.

The flip-flop 398 is configured to hold the reset signal RS and to output the held reset signal RS as the low-speed clock signal DIVCLK in synchronization with the reference clock signal REFCLK.

In the second embodiment, four adders, one subtractor, and one resistor are used to perform quantization and separation of division ratio. On the other hand, in the modified example, it is possible to achieve the functions with two adders and three resistors.

As described above, according to the modified example of the second example, it is possible to perform quantization or separation of division ratio with a simple configuration because the number of calculators is reduced.

It should be noted that the embodiments of the present disclosure are shown as an example for implementing the present disclosure. The matters in the embodiments of the present invention have corresponding relations to the invention specifying matters in the claims. Similarly, the invention specifying matters in the claims have corresponding relations to the matters in the embodiments of the present invention having the same names as the invention specifying matters. It should be noted that the present disclosure is not limited to the above-mentioned embodiments and various modifications can be made without departing from the gist of the present disclosure.

Moreover, the process procedures described in the embodiments may be regarded as a method including the series of procedures, and may be regarded as a program that causes a computer to execute the series of procedures, or as a storage medium that stores the program. As the storage medium, a CD (Compact Disc), an MD (MiniDisc), a DVD (Digital Versatile Disc), a memory card, a Blu-ray (registered trademark) disc may be used, for example.

It should be noted that the effects described above are not necessarily restrictive, and may be any of those described in the present disclosure.

It should be noted that the present disclosure may also take the following configurations.

(1) A clock generation circuit, including:
a delay clock generation unit configured to generate a predetermined number of delay clock signals having different delay time periods for a reference clock signal;
a low-speed clock generation unit configured to generate a low-speed clock signal having a lower frequency than the reference clock signal in accordance with a control signal that controls a phase;
a control signal processing unit configured to perform, on the control signal, a quantization process in which a value of the control signal is quantized into the predetermined number of discrete values and a modulation process in which a quantization error occurred in the quantization process is distributed in a band of frequencies higher than a predetermined frequency;
a selection unit configured to select any one of the predetermined number of delay clock signals in accordance with the control signal on which the quantization process and the modulation process are performed; and
an output unit configured to output the low-speed clock signal in synchronization with the selected delay clock signal.
(2) The clock generation circuit according to (1) above, in which
the control signal processing unit is configured to perform the quantization process on the control signal before performing the modulation process on the control signal.
(3) The clock generation circuit according to (2) above, in which
the modulation process includes generating an integration value by integrating a value of the control signal on which the quantization process is performed in synchronization with the low-speed clock signal, and the control signal processing unit is configured to perform delay control in the case where the integration value exceeds a predetermined value, the value of the control signal being converted into a difference between the integration value and the predetermined value in the delay control, the converted control signal as well as the low-speed clock signal being delayed in synchronization with the reference clock signal in the delay control.
(4) The clock generation circuit according to (1) above, in which
the control signal processing unit is configured to perform the modulation process on the control signal before performing the quantization process on the control signal.
(5) The clock generation circuit according to any one of (1) to (4) above, in which
the low-speed clock generation unit is configured to integrate the value of the control signal and to generate, as the low-speed clock signal, a signal that represents whether or not the integrate value exceeds a predetermined value, in synchronization with the reference clock signal.
(6) The clock generation circuit according to any one of (1) to (4) above, in which
the control signal includes a predetermined division ratio, and
the low-speed clock generation unit is configured to divide the reference clock signal with the predetermined division ratio included in the control signal and to supply the divided reference clock signal as the low-speed clock signal.
(7) The clock generation circuit according to any one of (1) to (6) above, in which
the control signal processing unit is configured to perform a delta-sigma modulation process as the modulation process.
(8) An electronic apparatus, including:
a delay clock generation unit configured to generate a predetermined number of delay clock signals having different delay time periods for a reference clock signal;
a low-speed clock generation unit configured to generate a low-speed clock signal having a lower frequency than the reference clock signal in accordance with a control signal that controls a phase;
a control signal processing unit configured to perform, on the control signal, a quantization process in which a value of the control signal is quantized into the predetermined number of discrete values and a modulation process in which a quantization error occurred in the quantization process is distributed in a band of frequencies higher than a predetermined frequency;
a selection unit configured to select any one of the predetermined number of delay clock signals in accordance with the control signal on which the quantization process and the modulation process are performed;
an output unit configured to output the low-speed clock signal in synchronization with the selected delay clock signal; and
an operation circuit configured to operate in synchronization with the output low-speed clock signal.

It should be understood by those skilled in the art that various modifications, combinations, sub-combinations and alterations may occur depending on design requirements and other factors insofar as they are within the scope of the appended claims or the equivalents thereof.

What is claimed is:

1. A clock generation circuit, comprising:
a delay clock generation unit configured to generate a predetermined number of delay clock signals having different delay time periods for a reference clock signal;
a low-speed clock generation unit configured to generate a low-speed clock signal having a lower frequency than the reference clock signal in accordance with a control signal that controls a phase;
a control signal processing unit configured to perform, on the control signal, a quantization process in which a value of the control signal is quantized into the predetermined number of discrete values and a modulation process in which a quantization error occurred in the quantization process is distributed in a band of frequencies higher than a predetermined frequency;
a selection unit configured to select any one of the predetermined number of delay clock signals in accordance with the control signal on which the quantization process and the modulation process are performed; and
an output unit configured to output the low-speed clock signal in synchronization with the selected delay clock signal.

2. The clock generation circuit according to claim 1, wherein
the control signal processing unit is configured to perform the quantization process on the control signal before performing the modulation process on the control signal.

3. The clock generation circuit according to claim 2, wherein
the modulation process includes generating an integration value by integrating a value of the control signal on which the quantization process is performed in synchronization with the low-speed clock signal, and
the control signal processing unit is configured to perform delay control in the case where the integration value exceeds a predetermined value, the value of the control signal being converted into a difference between the integration value and the predetermined value in the delay control, the converted control signal as well as the low-speed clock signal being delayed in synchronization with the reference clock signal in the delay control.

4. The clock generation circuit according to claim 1, wherein
the control signal processing unit is configured to perform the modulation process on the control signal before performing the quantization process on the control signal.

5. The clock generation circuit according to claim 1, wherein
the low-speed clock generation unit is configured to integrate the value of the control signal and to generate, as the low-speed clock signal, a signal that represents whether or not the integrate value exceeds a predetermined value, in synchronization with the reference clock signal.

6. The clock generation circuit according to claim 1, wherein
the control signal includes a predetermined division ratio, and
the low-speed clock generation unit is configured to divide the reference clock signal with the predetermined division ratio included in the control signal and to supply the divided reference clock signal as the low-speed clock signal.

7. The clock generation circuit according to claim 1, wherein
the control signal processing unit is configured to perform a delta-sigma modulation process as the modulation process.

8. An electronic apparatus, comprising:
a delay clock generation unit configured to generate a predetermined number of delay clock signals having different delay time periods for a reference clock signal;
a low-speed clock generation unit configured to generate a low-speed clock signal having a lower frequency than the reference clock signal in accordance with a control signal that controls a phase;
a control signal processing unit configured to perform, on the control signal, a quantization process in which a value of the control signal is quantized into the predetermined number of discrete values and a modulation process in which a quantization error occurred in the quantization process is distributed in a band of frequencies higher than a predetermined frequency;
a selection unit configured to select any one of the predetermined number of delay clock signals in accordance with the control signal on which the quantization process and the modulation process are performed;
an output unit configured to output the low-speed clock signal in synchronization with the selected delay clock signal; and
an operation circuit configured to operate in synchronization with the output low-speed clock signal.

* * * * *